(12) United States Patent
Ishizuka et al.

(10) Patent No.: US 8,753,798 B2
(45) Date of Patent: Jun. 17, 2014

(54) PROCESS FOR FORMING A HYDROPHILIC COATING AND HYDROPHILIC COATING, AND PROCESS FOR FORMING AN INK JET RECORDING HEAD AND INK JET RECORDING HEAD

(75) Inventors: Kazunari Ishizuka, Suntou-gun (JP); Ken Ikegame, Atsugi (JP)

(73) Assignee: Canon Kabushiki Kaisha, Tokyo (JP)

( * ) Notice: Subject to any disclaimer, the term of this patent is extended or adjusted under 35 U.S.C. 154(b) by 183 days.

(21) Appl. No.: 13/281,172

(22) Filed: Oct. 25, 2011

(65) Prior Publication Data

US 2012/0115089 A1 May 10, 2012

(30) Foreign Application Priority Data

Nov. 9, 2010 (JP) ................................. 2010-250778

(51) Int. Cl.
*G03F 7/00* (2006.01)

(52) U.S. Cl.
USPC .......................................... 430/320; 430/325

(58) Field of Classification Search
USPC .......................................... 430/312, 320, 325
See application file for complete search history.

(56) References Cited

U.S. PATENT DOCUMENTS

| 4,657,631 | A | 4/1987 | Noguchi |
| 7,670,757 | B2 * | 3/2010 | Shiba et al. .................. 430/320 |
| 7,687,552 | B2 | 3/2010 | Otaka et al. |
| 7,709,554 | B2 | 5/2010 | Otaka et al. |
| 7,887,162 | B2 | 2/2011 | Otaka et al. |
| 7,947,336 | B2 | 5/2011 | Otaka et al. |
| 2007/0077520 | A1 * | 4/2007 | Maemoto .................. 430/270.1 |
| 2010/0028803 | A1 * | 2/2010 | Sugimoto et al. .......... 430/270.1 |
| 2011/0139330 | A1 | 6/2011 | Ikegame et al. |
| 2012/0115985 | A1 * | 5/2012 | Ishizuka et al. ............... 523/400 |

FOREIGN PATENT DOCUMENTS

| JP | 6-122210 A | 5/1994 |
| JP | 6-45242 B2 | 6/1994 |

OTHER PUBLICATIONS

Ishizuka et al., U.S. Appl. No. 13/281,124, filed Oct. 25, 2011.

* cited by examiner

*Primary Examiner* — Stewart Fraser
(74) *Attorney, Agent, or Firm* — Fitzpatrick, Cella, Harper and Scinto

(57) ABSTRACT

A process for forming a hydrophilic coating and a hydrophilic coating, the process including the steps of: (1) forming, on a substrate, a first coating resin layer including a first cationic polymerization resin and a first photoacid generator; (2) laminating, on the first coating resin layer, a second coating resin layer including a second cationic polymerization resin which includes an acid-cleavable linkage in its main chain, and a second photoacid generator which generates methide acid by irradiation with an active energy ray including ultraviolet light; (3) forming a coating by curing the first coating resin layer and the second coating resin layer through exposure of the first coating resin layer and the second coating resin layer to the active energy ray to conduct development; and (4) forming a hydrophilic coating by hydrophilizing a surface of the coating through heat treatment of the coating.

19 Claims, 5 Drawing Sheets

PROCESS FOR FORMING A HYDROPHILIC COATING AND HYDROPHILIC COATING, AND PROCESS FOR FORMING AN INK JET RECORDING HEAD AND INK JET RECORDING HEAD

BACKGROUND OF THE INVENTION

1. Field of the Invention

The present invention relates to a process for forming a hydrophilic coating and a hydrophilic coating formed by such process, and a process for forming an ink jet recording head including the hydrophilic coating and an ink jet recording head formed by such process.

2. Description of the Related Art

A technology for performing patterning by processing a resin composition by photolithography is applied in a variety of fields. Examples of the technology include a process for forming an ink jet recording head.

An ink jet recording head for performing recording by ejecting ink onto a recording medium generally includes multiple fine ink ejection orifices, ink flow paths, and energy generating elements for generating energy necessary for ejecting ink to be provided in parts of the ink flow paths.

Japanese Patent Publication No. H06-045242 describes a process of producing such ink jet recording head. First, an ink flow path pattern is formed with a soluble resin on a substrate having energy generating elements formed thereon. Next, a coating resin layer including a cationic polymerization resin and a photoacid generator is formed on the ink flow path pattern, and ink ejection orifices are formed above the energy generating elements by photolithography. Finally, the soluble resin is dissolved and the coating resin layer is then cured to form an ink flow path member.

In general, in order to achieve high printing quality and constantly provide a stable printing effect in an ink jet printer, it is necessary that ink to be ejected from ink ejection orifices be constantly ejected in a vertical direction with respect to an ink ejection orifice surface. When a non-uniform ink pool is present in the ink ejection orifice surface at the time of ejection or the pool is formed during the ejection, ink to be ejected is attracted into the ink pool, and the flying direction of each of ink droplets deviates from the normal direction, with the result that normal ejection is not achieved in some cases. Further, when the array density of ink ejection orifices is increased in order to improve printing quality, an array distance between the ink ejection orifices becomes shorter depending on the increase, and hence the ejection is more liable to be affected by the non-uniform ink pool in the ink ejection orifice surface.

In view of the foregoing, there have been reported a large number of proposals concerning solving the above-mentioned problems by subjecting an ink ejection orifice surface to water-repellent treatment for repelling ink, thereby providing stable ink droplets. Further, in contrast, there has also been reported a proposal concerning ensuring uniform wetness in an ink ejection orifice surface by subjecting the ink ejection orifice surface to hydrophilic treatment for wetting the surface with ink.

Japanese Patent Application Laid-Open No. H06-122210 describes those surface treatment processes. For example, examples of the process for subjecting an ink ejection orifice surface to water-repellent treatment include a process including applying a fluorine-based water repellent. Meanwhile, examples of the process for subjecting an ink ejection orifice surface to hydrophilic treatment include a process including performing hydrophilization by generating a polar group in the ink ejection orifice surface by acid treatment, plasma treatment, or the like.

As described above, the conventional processes each require an apparatus exclusively used for acid treatment, plasma treatment, or the like in the formation of a hydrophilic coating, and the hydrophilic coating cannot be formed with a photolithography apparatus alone, with the result that a large burden is imposed in some cases.

As described above, even in the case where an ink jet recording head is formed by photolithography, a process including applying a fluorine-based water repellent or the like has only to be employed in order to subject an ink ejection orifice surface to water-repellent treatment, and a conventional apparatus may be used. However, an apparatus exclusively used for acid treatment, plasma treatment, or the like is required for subjecting the ink ejection orifice surface to the hydrophilic treatment, and the hydrophilic coating cannot be formed with the conventional apparatus alone, with the result that a large burden is imposed on a forming step in some cases.

An object of the present invention is to provide a process for forming a hydrophilic coating easily by photolithography without requiring an apparatus exclusively used for hydrophilic treatment and a hydrophilic coating formed by the process. Another object of the present invention is to provide a process for forming an ink jet recording head including the hydrophilic coating and an ink jet recording head formed by the process.

SUMMARY OF THE INVENTION

According to the present invention, there is provided a process for forming a hydrophilic coating, which is a coating having a hydrophilized surface, the process including the steps of:

(1) forming, on a substrate, a first coating resin layer including a first cationic polymerization resin and a first photoacid generator;

(2) laminating, on the first coating resin layer, a second coating resin layer including a second cationic polymerization resin which includes an acid-cleavable linkage in its main chain, and a second photoacid generator which generates methide acid by irradiation with an active energy ray including ultraviolet light;

(3) forming a coating by curing the first coating resin layer and the second coating resin layer through exposure of the first coating resin layer and the second coating resin layer to the active energy ray to conduct development; and (4) forming a hydrophilic coating by hydrophilizing a surface of the coating obtained in the step (3) through heat treatment of the coating.

In addition, the present invention is a hydrophilic coating which is obtained by the process for forming a hydrophilic coating, in which a surface of the hydrophilic coating has a polar group generated by cleavage of the second cationic polymerization resin, and the surface has a static contact angle with pure water of 20° or less.

In addition, the present invention is a process for forming an ink jet recording head including: an ink flow path member which forms ejection orifices for ejecting ink and an ink flow path communicating with the ejection orifices and holding ink and is hydrophilized in its surface having the ejection orifices; and a substrate having energy generating elements formed thereon for generating energy necessary for ejecting ink, the process including the steps of:

(I) forming a first coating resin layer including a first cationic polymerization resin and a first photoacid generator on the substrate having formed thereon the energy generating elements;
(II) laminating, on the first coating resin layer, a second coating resin layer including a second cationic polymerization resin which includes an acid-cleavable linkage in its main chain, and a second photoacid generator which generates methide acid by irradiation with an active energy ray including ultraviolet light;
(III) producing a coating having the ejection orifices formed therein by curing the first coating resin layer and the second coating resin layer through exposure of the first coating resin layer and the second coating resin layer to the active energy ray to conduct development; and
(IV) forming the ink flow path member by hydrophilizing a surface having the ejection orifices of the coating obtained in the step (III) through heat treatment of the coating.

In addition, the present invention is an ink jet recording head formed by the process for forming an ink jet recording head, in which a surface having the ejection orifices of the ink jet recording head has a polar group generated by cleavage of the second cationic polymerization resin, and the surface having the ejection orifices has a static contact angle with pure water of 20° or less.

Further features of the present invention will become apparent from the following description of exemplary embodiments with reference to the attached drawings.

DESCRIPTION OF THE EMBODIMENTS

Figure 1:
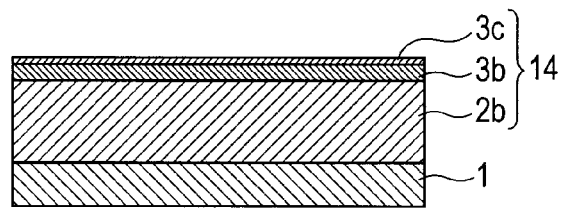
FIG. 1 is a schematic cross-sectional view of a hydrophilic coating formed by a process for forming a hydrophilic coating according to the present invention.

The inventor of the present invention has made intensive studies in order to solve the above-mentioned problems. As a result, the inventor has found a process for forming a hydrophilic coating by generating a polar group in a surface of a coating resin layer including a specific cationic polymerization resin and a specific photoacid generator by photolithography. It should be noted that the "hydrophilic coating" as used herein refers to a coating having a static contact angle with pure water of 20° or less. According to the present invention, the hydrophilic coating can be formed easily by conventional photolithography without requiring any apparatus exclusively used for hydrophilic treatment. The process for forming a hydrophilic coating according to the present invention is applicable to a process for forming a semiconductor, an MEMS field, and the like as well as a process for forming an ink jet recording head.

Hereinafter, the present invention is specifically described with reference to drawings. It should be noted that in the following description, a construction having the same function is provided with the same numeral in the drawings, and its description may be omitted.

A process for forming a hydrophilic coating according to the present invention includes the steps of:
(1) forming, on a substrate, a first coating resin layer including a first cationic polymerization resin and a first photoacid generator;
(2) laminating, on the first coating resin layer, a second coating resin layer including a second cationic polymerization resin which includes an acid-cleavable linkage in its main chain, and a second photoacid generator which generates methide acid by irradiation with an active energy ray including ultraviolet light;
(3) forming a coating by curing the first coating resin layer and the second coating resin layer through exposure of the first coating resin layer and the second coating resin layer to the active energy ray to conduct development; and
(4) forming a hydrophilic coating by hydrophilizing a surface of the coating obtained in the step (3) through heat treatment of the coating.

FIG. 1 illustrates an example of a hydrophilic coating formed by the process for forming a hydrophilic coating according to the present invention. A substrate is represented by reference numeral 1 and a coating having a hydrophilized surface (hydrophilic coating) is represented by reference numeral 14. The hydrophilic coating 14 has a first coating 2b, a second coating 3b, and a hydrophilic layer 3c on its surface. It should be noted that the first coating 2b is formed by curing a first coating resin layer 2a illustrated in each of FIGS. 2A to 2C. Further, the second coating 3b is formed by curing a second coating resin layer 3a. In addition, the hydrophilic layer 3c is formed by hydrophilizing a coating surface, i.e., a surface of the second coating 3b, through heat treatment of those coatings.

Hereinafter, a process for forming the hydrophilic coating of FIG. 1 is described with reference to FIGS. 2A to 2E. However, the present invention is not limited thereto.

Step (1)

Figure 2A:
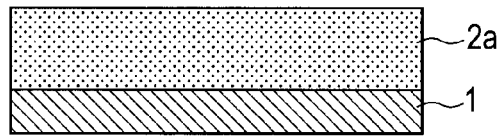
FIGS. 2A, 2B, 2C, 2D and 2E are views for illustrating the respective steps of the process for forming a hydrophilic coating according to the present invention.

First, a first coating resin layer 2a including a first cationic polymerization resin and a first photoacid generator is formed on a substrate 1 (FIG. 2A). It should be noted that the first coating resin layer 2a may be formed directly on a surface of the substrate 1, and alternatively, any other layer (for example, positive photosensitive resin layer) may be provided between the substrate 1 and the coating resin layer 2a.

Examples of the first cationic polymerization resin include an epoxy-based resin, an oxetane-based resin, and a vinyl ether-based resin. Of those, an epoxy-based resin or an oxetane-based resin is preferably used in consideration of a small curing shrinkage, satisfactory adherence, and the like. In addition, it is more preferred to use, as the first cationic polymerization resin, a compound free of an acid-cleavable linkage such as an ether linkage or an ester linkage in its main chain.

A cationic polymerization resin including an ether linkage or an ester linkage in its main chain is, for example, a compound represented by each of the following formula 1-a to the following formula 1-i. In contrast, a cationic polymerization resin represented, for example, by each of the following formula 2-a to the following formula 2-e has an ether linkage but is defined as being free of an ether linkage in its main chain in the present invention.

That is, here, it is preferred to use, as the first cationic polymerization resin, such cationic polymerization resin as represented, for example, by each of the formula 2-a to the formula 2-e. It should be noted that the "main chain" means a chain which serves as a backbone in a carbon skeleton of a chain compound and has the maximum number of carbon atoms.

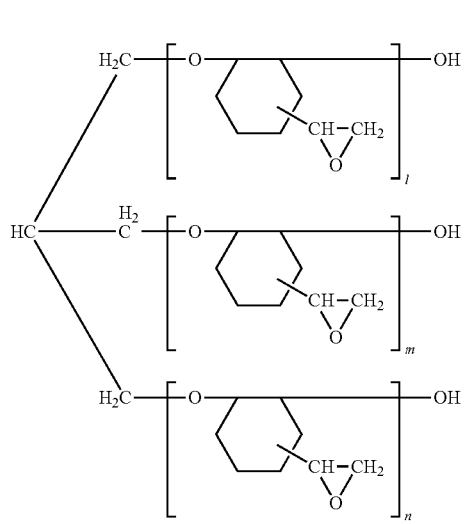

(1-a)

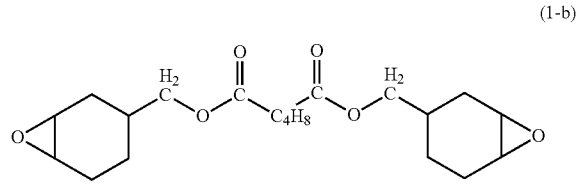

(1-b)

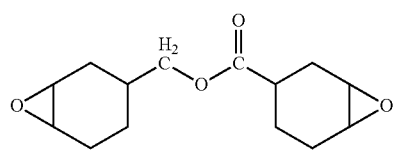

(1-c)

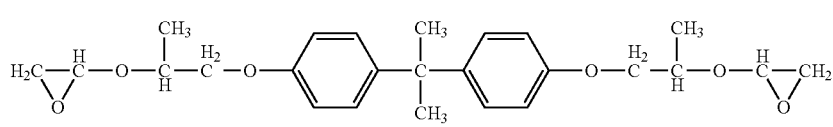

(1-d)

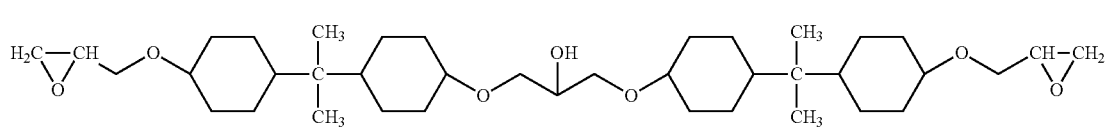

(1-e)

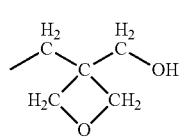

(1-f)

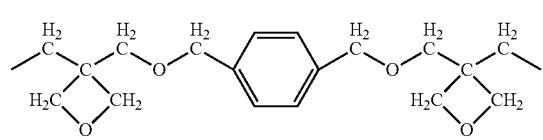

(1-g)

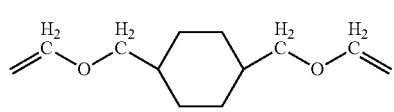

(1-h)

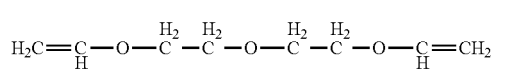

(1-i)

In the above-mentioned formula 1-a, l, m, and n each independently represent an integer of 1 or more.

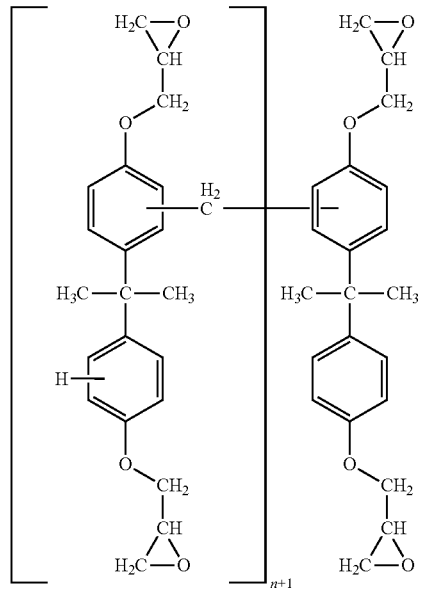

(2-a)

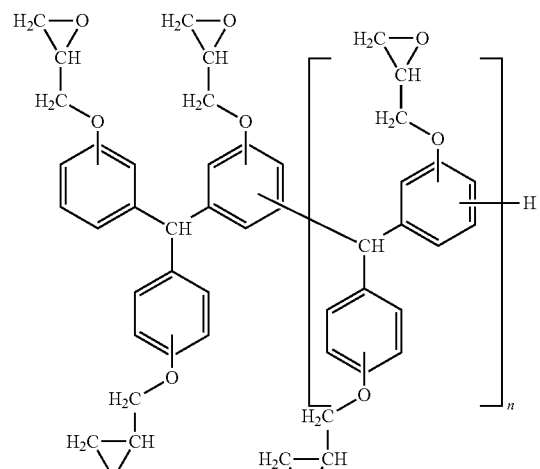

(2-c)

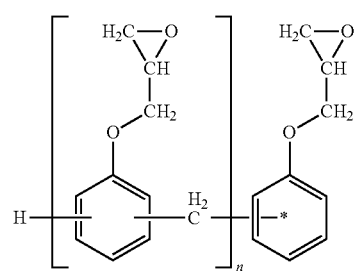

(2-d)

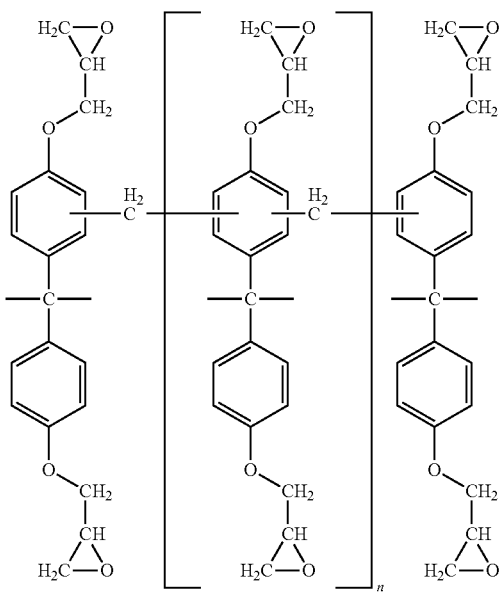

(2-b)

(2-e)

In the formula 2-a to the formula 2-e, n represents an integer of 1 or more.

When a cationic polymerization resin which is free of an acid-cleavable linkage in its main chain (compound represented, for example, by each of the formula 2-a to the formula 2-e) is used as the first cationic polymerization resin, the first photoacid generator may be selected from known photoacid generators and used without any particular limitation. However, when a cationic polymerization resin which includes an acid-cleavable linkage in its main chain (compound represented, for example, by each of the formula 1-a to the formula 1-i) is used as the first cationic polymerization resin, it is preferred to use the following photoacid generator as the first photoacid generator. That is, the photoacid generator is a photoacid generator which generates antimonic acid or an acid having a weaker acid strength than that of antimonic acid. The reason for the foregoing is described later.

That is, such a first photoacid generator that generates antimonic acid or the like by irradiation with light, more specifically an active energy ray including ultraviolet light, can be used even when any of the cationic polymerization resins is used as the first cationic polymerization resin. The photoacid generator which generates antimonic acid has a structure represented by the following formula 3 as an anion moiety.

SbF$_6$—  Formula 3

Specific examples of the photoacid generator which generates antimonic acid are represented by the following formula 4-a to the following formula 4-j, respectively.

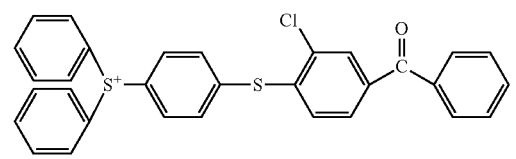
(4-a)

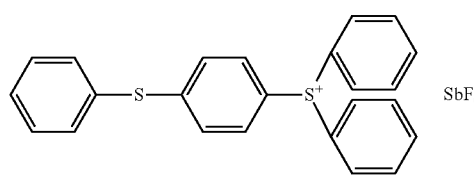
(4-b)

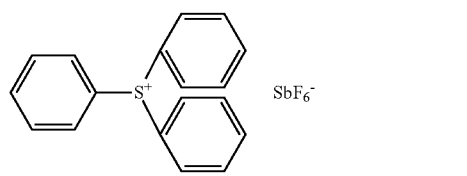
(4-c)

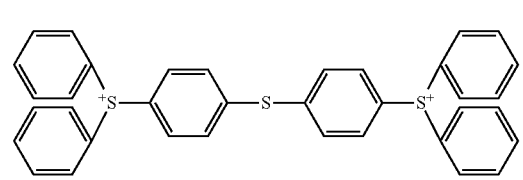
(4-d)

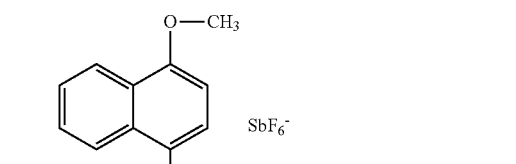
(4-e)

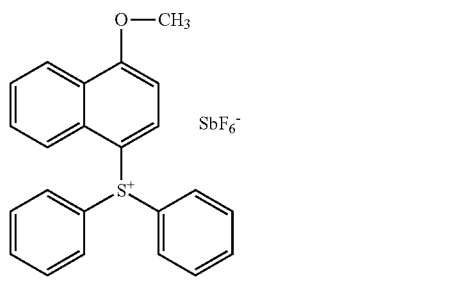
(4-f)

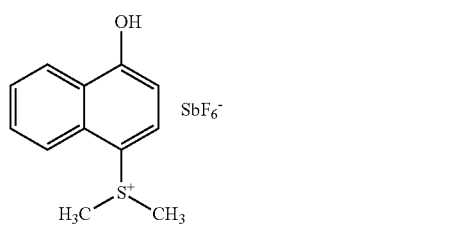
(4-g)

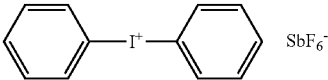
(4-h)

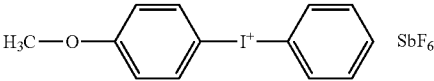
(4-i)

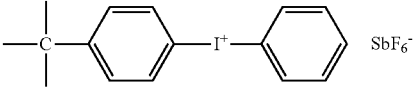
(4-j)

In addition, when a cationic polymerization resin which includes an acid-cleavable linkage in its main chain (compound represented, for example, by each of the formula 1-a to the formula 1-i) is used as the first cationic polymerization resin, the following photoacid generator can also be used as the first photoacid generator. That is, there may also be used, for example, a compound which generates an acid having a weaker acid strength than that of antimonic acid obtained by changing the anion moiety (SbF$_6^-$) of the compound represented by each of the above-mentioned formula 4-a to formula 4-j to PF$_6^-$ or CH$_3$COO$^-$.

A process for forming the first coating resin layer 2a is, for example, the following process. That is, the process is a process including applying a solution which is obtained by appropriately dissolving materials for the first coating resin layer 2a (including a first cationic polymerization resin and a first photoacid generator) in a solvent, onto the substrate 1 by a spin coating process. It should be noted that the materials for the first coating resin layer 2a may also be applied onto the substrate 1 without using any solvent, but in the case of using a solvent, the solvent is appropriately selected from solvents which do not dissolve the substrate 1 and used.

It should be noted that the first coating resin layer 2a may include a functionality-imparting material such as an ultraviolet absorber or a silane coupling agent in addition to the foregoing. It should be noted that the content of the first cationic polymerization resin in the coating resin layer 2a is preferably 50 mass % or more with respect to the total amount in the case of using a solvent from the viewpoint of coating property. Further, the content of the first photoacid generator in the coating resin layer 2a is preferably about 1 mass % with respect to the resin from the viewpoint of reactivity.

Step (2)

Figure 2B:
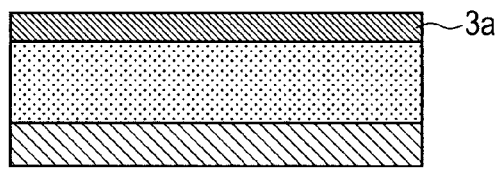

Next, a second coating resin layer 3a including a second cationic polymerization resin and a second photoacid generator is laminated on the first coating resin layer 2a (FIG. 2B).

The second cationic polymerization resin may be any cationic polymerization resin having an acid-cleavable linkage in its main chain, and examples thereof include such cationic polymerization resin having an ether linkage or an ester linkage in its main chain as represented by each of the formula 1-a to the formula 1-i.

Further, the second photoacid generator may be any photoacid generator which generates methide acid by irradiation with an active energy ray including ultraviolet light. The photoacid generator which generates methide acid has a structure represented by the following formula 5 as an anion moiety.

Formula 5
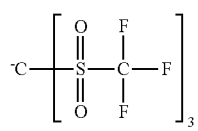
Specific examples of the photoacid generator which generates methide acid are represented by the following formula 6-a to the following formula 6-j, respectively.
(6-a)
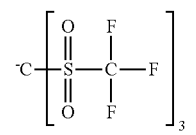
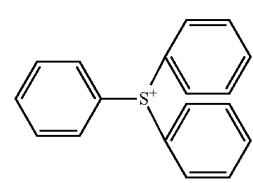 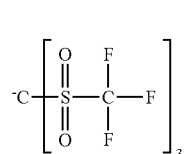
(6-b)
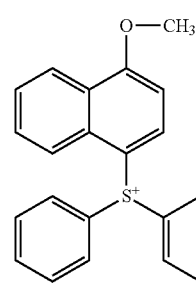 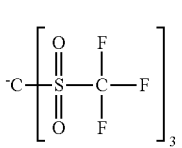
(6-c)
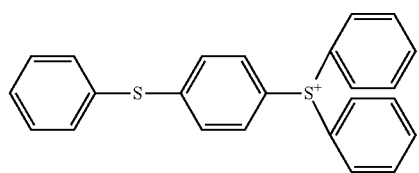
(6-d)
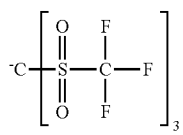
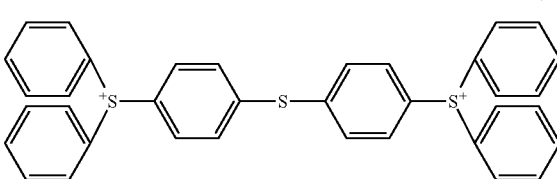
(6-e)
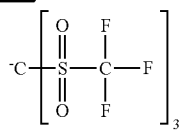
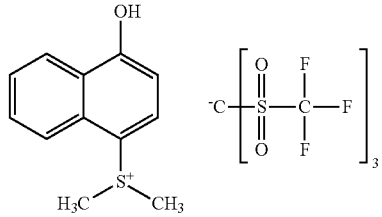 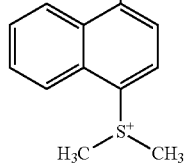
(6-f)
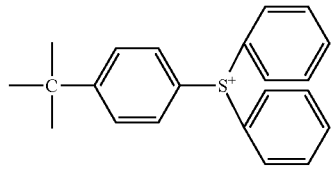
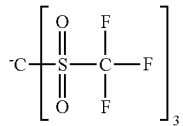 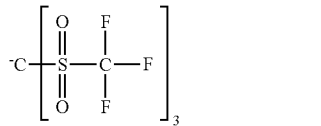
(6-g)
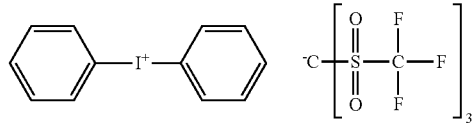
(6-h)
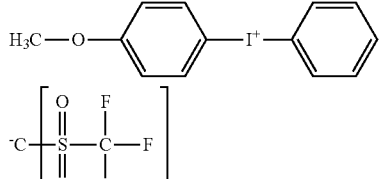 
(6-i)
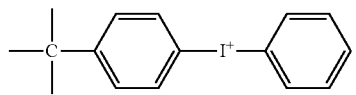
(6-j)

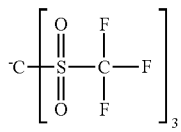

A process for forming the second coating resin layer 3a is, for example, the following process. That is, the process is a process including applying a solution which is obtained by appropriately dissolving materials for the second coating resin layer 3a (including a second cationic polymerization resin and a second photoacid generator) in a solvent, onto the first coating resin layer 2a by a spin coating process. The materials for the second coating resin layer 3a may also be applied onto the first coating resin layer 2a without using any solvent, but in the case of using a solvent, the solvent is appropriately selected from solvents which do not dissolve the coating resin layer 2a and used.

It should be noted that the second coating resin layer 3a may include a functionality-imparting material such as an ultraviolet absorber or a silane coupling agent in addition to the foregoing. It should be noted that the content of the second cationic polymerization resin in the coating resin layer 3a is preferably 50 mass % or more with respect to the total amount in the case of using a solvent from the viewpoint of coating property. Further, the content of the second photoacid generator in the coating resin layer 3a is preferably about 1 mass % with respect to the resin from the viewpoint of reactivity.

The thickness of the second coating resin layer 3a is not particularly limited as long as the cationic polymerization resin is not completely decomposed by an acid generated from the photoacid generator in the step (4) to be described later, but is desirably 5 μm or more in terms of a thickness on the first coating resin layer 2a.

Step (3)

Figure 2C:
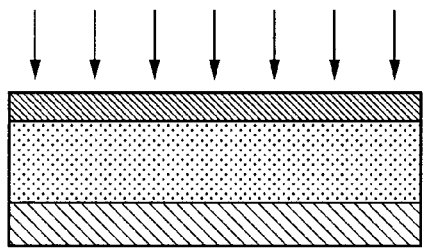
Figure 2D:
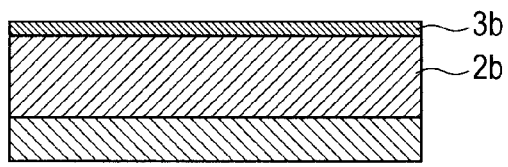

Next, a coating is formed by curing the first coating resin layer 2a and the second coating resin layer 3a through exposure of the first coating resin layer 2a and the second coating resin layer 3a to an active energy ray including ultraviolet light (arrows of FIG. 2C) to conduct development (FIGS. 2C and 2D). It should be noted that the coating is formed of a first coating 2b and a second coating 3b as illustrated in FIG. 2D.

Step (4)

Figure 2E:
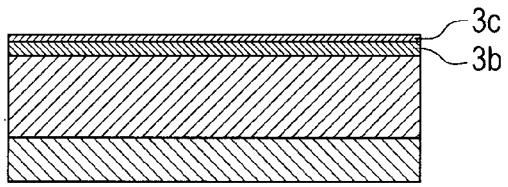

Next, a hydrophilic layer 3c is formed on a surface of the coating, i.e., a surface layer of the second coating 3b, through heat treatment of the coating (FIG. 2E). It should be noted that the "surface layer of the second coating 3b" means a surface on which the hydrophilic layer is formed. The heat treatment may be carried out in an oven or on a hot plate. The heat treatment may be carried out at any temperature as long as methide acid generated from the second photoacid generator in the second coating resin layer 3a can cause acid cleavage of an ether linkage or ester linkage group present in the main chain of the second cationic polymerization resin to generate a polar group, hydrophilize the surface layer, and form the hydrophilic layer 3c.

Figure 3:
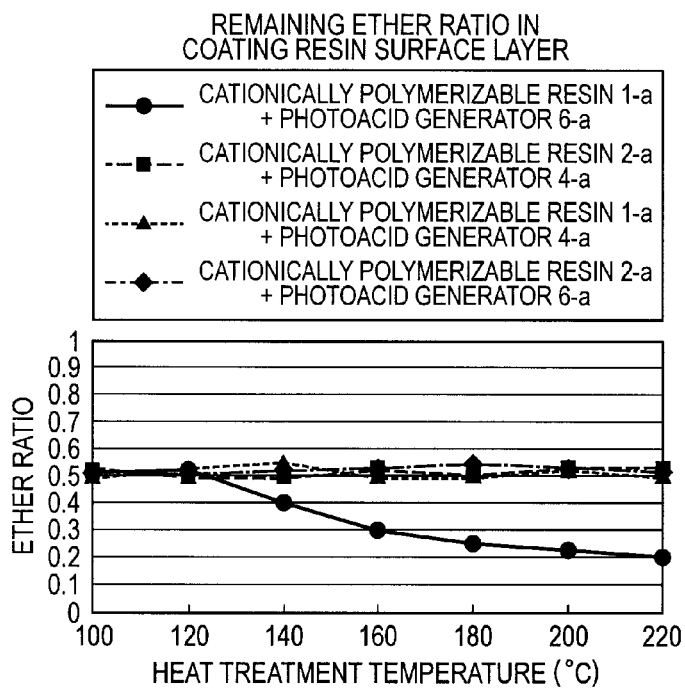
FIG. 3 is a graph showing remaining ether ratios in hydrophilic coating surfaces including second cationic polymerization resins.

Here, in order to grasp a correlation between the heat treatment temperatures in the step (4) and the remaining ether ratios in the hydrophilic layer 3c, measurement was carried out under the following conditions. Specifically, a second coating resin layer including the second cationic polymerization resin which includes an ether linkage as an acid-cleavable linkage in its main chain and the second photoacid generator each described in Table 1 was formed directly on the substrate 1 without providing the first coating resin layer 2a. Then, the coating resin layer was subjected to exposure, development, and heat treatment, and the number of remaining ethers in the surface layer of the coating resin layer, i.e., the hydrophilic layer 3c, was measured. FIG. 3 shows a graph showing a correlation between the heat treatment temperatures and the remaining ether ratios in the hydrophilic layer 3c under the conditions. It should be noted that the number of ethers is expressed as a ratio of an ether-derived peak intensity when measured with a Fourier transform infrared spectrophotometer (FT-IR) to a peak intensity as a reference. It should be noted that the peak intensity as a reference used here is that of a CH group.

TABLE 1

| Coating resin layer | | |
|---|---|---|
| | Cationic polymerization resin | Photoacid generator |
| No. 1 | | |

TABLE 1-continued
| | Coating resin layer | |
|---|---|---|
| | Cationic polymerization resin | Photoacid generator |
| No. 2 | 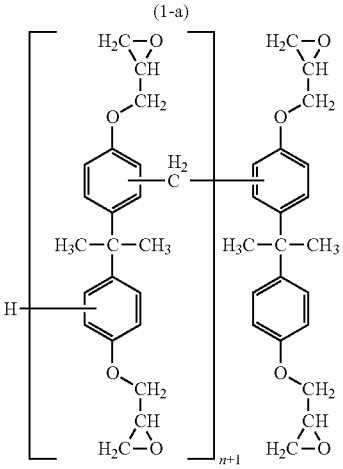<br>(1-a) | 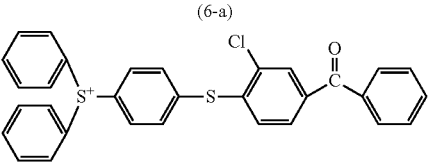<br>(6-a) |
| No. 3 | 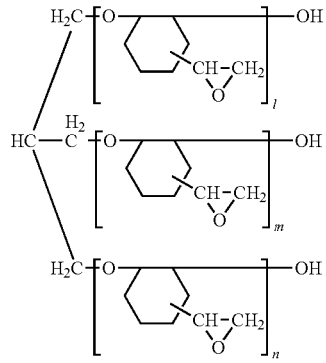<br>(2-a) | 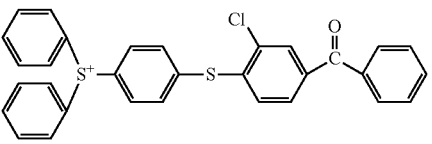 [SMILES: O=C(c1ccccc1)c1ccc(Sc2ccc([S+](c3ccccc3)c3ccccc3)cc2)c(Cl)c1]<br>(4-a) |
| No. 4 | 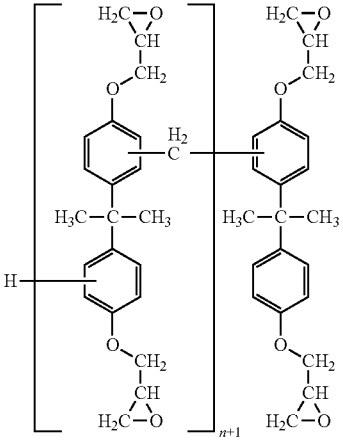<br>(1-a) | 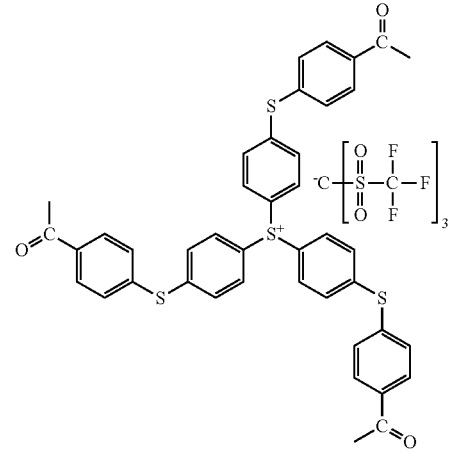<br>(6-a) |

As seen from FIG. 3, in the following combination, the number of remaining ethers in the hydrophilic layer 3c including the second cationic polymerization resin decreases depending on the heat treatment temperature. That is, the combination is a combination of No. 1 described in Table 1, and is a combination including a cationic polymerization resin (1-a), which has an acid-cleavable linkage in its main chain, as the second cationic polymerization resin and a photoacid generator (6-a), which generates methide acid, as the second photoacid generator in the second coating resin layer 3a. This indicates that methide acid generated from the photoacid generator (6-a) causes acid cleavage of an ether linkage in the main chain of the cationic polymerization resin (1-a) through heat treatment to generate a polar group (cause a polar group to be present).

It should be noted that a similar tendency is expected to be observed even in the case of using a second cationic polymerization resin including an acid-cleavable linkage other than the ether linkage.

It should be noted that it is understood that No. 3 of Table 1, i.e., a combination including the cationic polymerization resin (1-a) and a photoacid generator (4-a), which generates antimonic acid, in the second coating resin layer 3a does not show a decrease in number of ethers in the hydrophilic layer 3c due to heat treatment. That is, this indicates that even the cationic polymerization resin which includes an acid-cleavable linkage in its main chain does not undergo acid cleavage by antimonic acid. This is based on the acid strength of the acid generated from the photoacid generator.

Here, the acid strength of the acid generated from the photoacid generator is described with reference to Table 2 below. Table 2 is an example showing photoacid generators and the order of the acid strengths of acids generated from the photoacid generators. It should be noted that the strength of the acid generated from the photoacid generator may be measured by the following process. That is, the strength may be measured by using resin compositions including the same kind of cationic polymerization resin and the same addition amount (molar number) of photoacid generators, and comparing exposure amounts required for forming a certain pattern. It can be said that the smaller exposure amount indicates that the photoacid generator generates an acid having a stronger acid strength. Thus, the order of the acid strengths is the order of methide acid>antimonic acid>phosphoric acid>acetic acid.

TABLE 2

| Photoacid generator | Acid generated | Exposure amount ($J/m^2$) | Order of acid strengths |
|---|---|---|---|
| (structure) $S^+$ $(CF_3SO_2)_3$–$C^-$ | Methide acid | 800 | 1 |
| (structure) $S^+$ $SbF_6^-$ | Antimonic acid | 2,500 | 2 |
| (structure) $S^+$ $PF_6^-$ | Phosphoric acid | 20,000 | 3 |
| (structure) $S^+$ $CH_3COO^-$ | Acetic acid | >30,000 | 4 |

That is, it is understood that the standard for the acid strength necessary for the acid cleavage of the cationic polymerization resin which includes an acid-cleavable linkage in its main chain is methide acid. In other words, the second cationic polymerization resin needs to be cleavable by methide acid.

Figure 4:
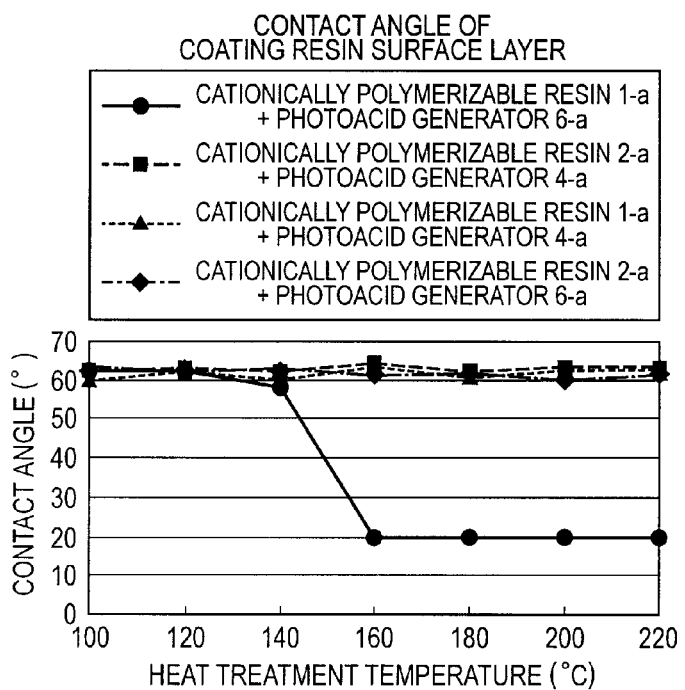
FIG. 4 is a graph showing contact angles of hydrophilic coating surfaces including second cationic polymerization resins.

Next, as is the case with FIG. 3, FIG. 4 shows a correlation between the heat treatment temperatures and the static contact angles with pure water of surfaces of hydrophilic coatings, the hydrophilic coatings being each obtained by directly forming, on a substrate, the second coating resin layer including the second cationic polymerization resin and the second photoacid generator each described in Table 1 and subjecting the layer to exposure and heat treatment. As seen from FIGS. 3 and 4, the contact angle decreases depending on a decrease in number of remaining ethers in the hydrophilic layer 3c. It should be noted that the static contact angle with pure water of the hydrophilic coating surface was measured using a contact angle meter (trade name: "FACE CA-XA150" manufactured by Kyowa Interface Science Co., Ltd.). The measurement limit of the method of measuring the contact angle carried out here is 20° or less.

That is, as demonstrated in FIGS. 3 and 4, in the following combination, the surface layer of the second coating 3b including the second cationic polymerization resin is easily hydrophilized at a heat treatment temperature of 160° C. or more. The combination is a combination including the cationic polymerization resin (1-a), which has an acid-cleavable linkage in its main chain, and the photoacid generator (6-a), which generates methide acid, in the second coating resin layer 3a.

Figure 5:
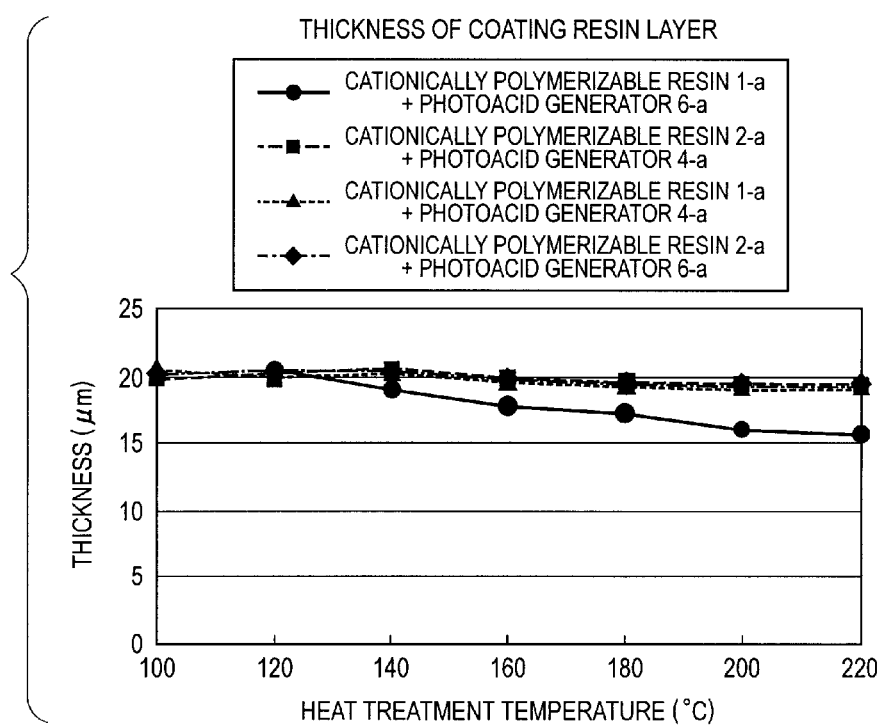
FIG. 5 is a graph showing thicknesses of hydrophilic coatings including second cationic polymerization resins.

Next, as is the case with FIGS. 3 and 4, FIG. 5 shows a correlation between the heat treatment temperatures and the thicknesses after heat treatment of the hydrophilic coatings formed with the combinations described in Table 1 without forming the first coating resin layer. It should be noted that the thickness of the second coating resin layer before heat treatment was 20 μm. As seen from FIGS. 3 and 5, the resin thickness after heat treatment decreases depending on a decrease in number of remaining ethers in the hydrophilic layer 3c. That is, this indicates that not only the ether linkage in the surface layer of the resin but also the ether linkage in the resin is cleaved. In this case, there is a risk of a reduction in reliability of the resin layer such as a reduction in adherence between the resin layer and the substrate. That is, it is preferred to use a compound free of an acid-cleavable linkage as the first cationic polymerization resin in the resin layer (first coating resin layer in the present invention) in close contact with the substrate.

In order to easily hydrophilize the surface layer of the second coating resin layer without impairing the reliability of the resin layer as described above, the following procedure is preferably employed. That is, during the formation of the first coating resin layer 2a on the substrate 1, such a cationic polymerization resin which is free of an acid-cleavable linkage in its main chain as represented, for example, by each of the formula 2-a to the formula 2-e is used as the first cationic polymerization resin. Next, the second coating resin layer 3a including such a second cationic polymerization resin which includes an acid-cleavable linkage in its main chain as represented, for example, by each of the formula 1-a to the formula 1-i, and such a second photoacid generator which generates methide acid as represented, for example, by each of the formula 6-a to the formula 6-j, is laminated on the layer 2a. Then, it is necessary to hydrophilize the surface layer of the second coating resin layer 3a.

Further, the upper limit of the heat treatment temperature in the step (4) is preferably 250° C. or less in consideration of heat decomposition of the coating obtained in the step (3).

Next, an example of the process for forming an ink jet recording head is described below. In the steps in the process, the step of easily hydrophilizing a surface having ink ejection orifices (ejection orifice surface) is described by way of an example of the process for forming a hydrophilic coating of the present invention.

A process for forming an ink jet recording head according to the present invention is a process for forming an ink jet recording head including an ink flow path member and a substrate having energy generating elements formed thereon for generating energy necessary for ejecting ink. It should be noted that the ink flow path member forms ejection orifices for ejecting ink and an ink flow path communicating with the ejection orifices and holding ink, and is hydrophilized in its surface having the ejection orifices. In addition, the forming process of the present invention includes the steps of:

(I) forming a first coating resin layer including a first cationic polymerization resin and a first photoacid generator on the substrate having formed thereon the energy generating elements;

(II) laminating, on the first coating resin layer, a second coating resin layer including a second cationic polymerization resin which includes an acid-cleavable linkage in its main chain, and a second photoacid generator which generates methide acid by irradiation with an active energy ray including ultraviolet light;

(III) producing a coating having the ejection orifices formed therein by curing the first coating resin layer and the second coating resin layer through exposure of the first coating resin layer and the second coating resin layer to the active energy ray to conduct development; and (IV) forming the ink flow path member by hydrophilizing a surface having the ejection orifices of the coating obtained in the step (III) through heat treatment of the coating.

Figure 6:
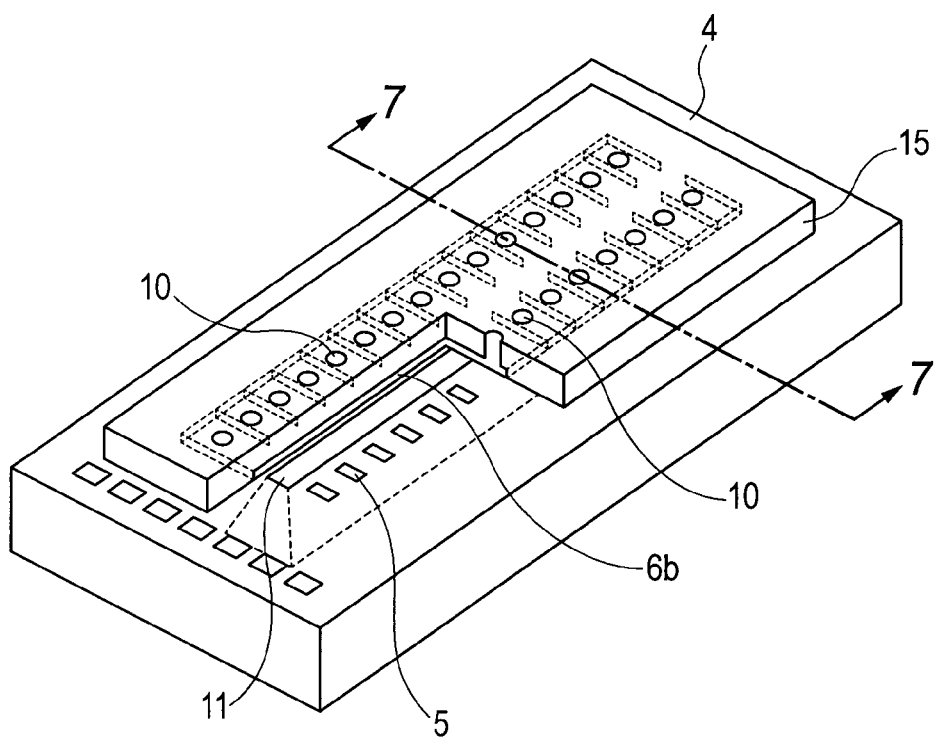
FIG. 6 is a schematic view of an ink jet recording head formed by a process for forming an ink jet recording head according to the present invention.

FIG. 6 illustrates an example of an ink jet recording head formed by the process for forming an ink jet recording head according to the present invention.

Figure 7:
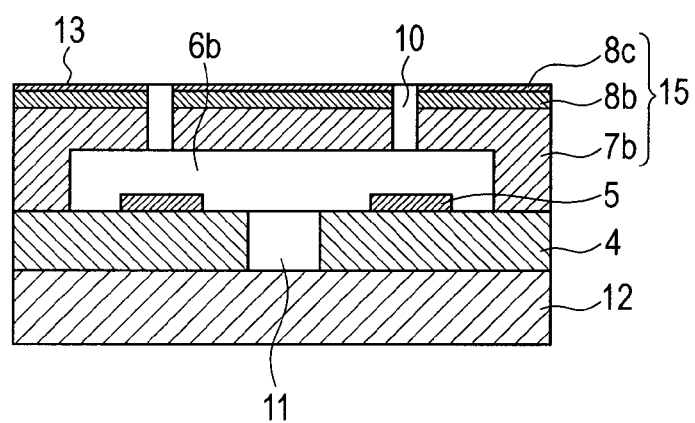
FIG. 7 is a schematic cross-sectional view of an ink jet recording head, which has an ink supply member and is formed by the process for forming an ink jet recording head according to the present invention.

The ink jet recording head illustrated in FIG. 6 has an ink flow path member 15 having a hydrophilized surface layer, i.e., a hydrophilic coating, on a substrate 4 having thereon multiple energy generating elements 5 for generating energy necessary for ejecting ink. It should be noted that, as illustrated in FIG. 7, the ink flow path member 15 has a first coating 7b, a second coating 8b, and a hydrophilic layer 8c as a surface layer. In addition, the ink flow path member 15 forms ink ejection orifices 10 for ejecting ink and an ink flow path 6b communicating with the ink ejection orifices 10 and holding ink. Further, the substrate 4 is provided with an ink supply port 11 for supplying ink to the ink flow path 6b. Further, FIG. 7 is a view illustrating a cross-section taken along the line 7-7 of FIG. 6 of an ink jet recording head having an ink supply member 12 bonded to the back surface of the substrate 4 in the ink jet recording head of FIG. 6.

Hereinafter, an exemplary embodiment of the present invention is described in detail. However, the present invention is not limited thereto.

Figure 8A:
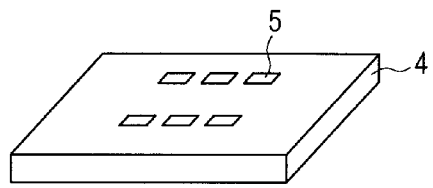
FIGS. 8A, 8B, 8C, 8D, 8E, 8F, 8G and 8H are views for illustrating the respective steps of the process for forming an ink jet recording head according to the present invention.

As illustrated in FIG. 8A, the multiple energy generating elements 5 are arranged on the substrate 4 in two arrays at a given pitch. It should be noted that a control signal input electrode (not shown) for driving the energy generating elements 5 is connected to the elements.

Hereinafter, the embodiment is described with reference to FIGS. 8B to 8H and 7. FIGS. 8B to 8H are step-by-step cross-sectional views each corresponding to the cross-section taken along the line 7-7 of FIG. 6.

Step (a1)

First, a positive photosensitive resin layer (not shown) including a positive photosensitive resin is formed on the substrate 4 having the energy generating elements 5 formed thereon. An ink flow path pattern 6a may be formed by patterning the positive photosensitive resin layer as necessary like a step (a2) to be described later.

The positive photosensitive resin included in the positive photosensitive resin layer is not particularly limited, but preferred is a material having a low absorbance for ultraviolet light used for exposure of a first coating resin layer 7a and a second coating resin layer 8a to be described later. Also preferred is a material sensitive to an active energy ray having a shorter wavelength than that of the ultraviolet light to be used, for example, excimer laser such as ArF laser or KrF laser, or Deep UV light. Examples of the material include polymethyl isopropenyl ketone, which can be exposed to Deep UV light.

A process for forming the positive photosensitive resin layer is, for example, the following process. First, the positive photosensitive resin is appropriately dissolved in a solvent and applied by a spin coating process. After that, the resultant may be subjected to prebaking to form the positive photosensitive resin layer.

The thickness of the positive photosensitive resin layer may be appropriately selected depending on a desired ink flow path height without any particular limitation, but is preferably 5 μm or more and 20 μm or less.

Step (a2)

Figure 8E:
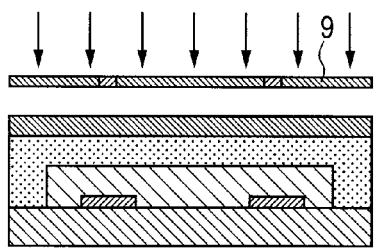
Figure 8B:
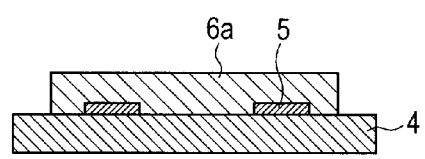

Next, the ink flow path pattern 6a is formed by patterning the positive photosensitive resin layer (FIG. 8B).

A process for patterning the positive photosensitive resin layer is, for example, the following process. First, the positive photosensitive resin layer is irradiated via a mask with an active energy ray capable of photosensitizing the positive photosensitive resin to perform pattern exposure. After that, the layer may be developed with, for example, a solvent capable of dissolving the positive photosensitive resin and subjected to rinsing treatment to form the ink flow path pattern 6a.

Step (a3): Corresponding to Step (I)

Figure 8F:
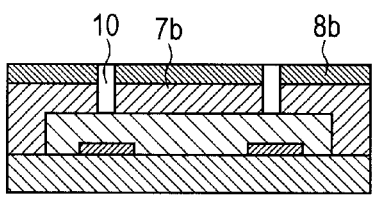
Figure 8C:
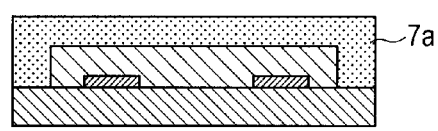

Next, the first coating resin layer 7a including a first cationic polymerization resin and a first photoacid generator is formed on the ink flow path pattern 6a and the substrate 4 (FIG. 8C).

It should be noted that examples of the first cationic polymerization resin include an epoxy-based resin, an oxetane-based resin, and a vinyl ether-based resin. Of those, an epoxy-based resin or an oxetane-based resin is preferably used in consideration of a small curing shrinkage, satisfactory adherence, and the like. In addition, it is more preferred to use, as the first cationic polymerization resin, a compound free of an acid-cleavable linkage such as an ether linkage or an ester linkage in its main chain. As described above, examples of the compound which is free of an acid-cleavable linkage include compounds represented by the formula 2-a to the formula 2-e.

Further, the first photoacid generator may be selected as necessary from known photoacid generators without any particular limitation in the case of using the cationic polymerization resin which is free of an acid-cleavable linkage in its main chain (compound represented, for example, by each of the formula 2-a to the formula 2-e) as the first cationic polymerization resin. However, in the case of using the cationic polymerization resin which includes an acid-cleavable linkage in its main chain (compound represented, for example, by each of the formula 1-a to the formula 1-i) as the first cationic polymerization resin, it is preferred to use, as the first photoacid generator, a photoacid generator which generates an acid having a weaker acid strength than that of methide acid. This is because there is a risk of cleavage of the main chain of the cationic polymerization resin in the case of using the photoacid generator which generates methide acid.

Examples of the photoacid generator which generates an acid having a weaker acid strength than that of methide acid include compounds represented by the formula 4-a to the formula 4-j as described above.

A process for forming the first coating resin layer 7a is, for example, the following process. That is, the process is a process including applying a solution, which is obtained by appropriately dissolving materials for the first coating resin layer 7a in a solvent, onto the ink flow path pattern 6a and the substrate 4 by a spin coating process. It should be noted that the solvent for dissolving the materials for the coating resin layer 7a may be appropriately selected from solvents which do not dissolve the ink flow path pattern 6a and used.

The thickness of the first coating resin layer 7a is preferably 3 μm or more in terms of a thickness on the ink flow path pattern 6a (distance from the surface of the first coating resin layer 7a to the ink flow path pattern 6a) in consideration of the strength of the resin layer. Further, the upper limit of the thickness is not particularly limited as long as the developability at an ink ejection orifice portion is not impaired, but is preferably 50 μm or less in terms of a thickness on the ink flow path pattern 6a.

Step (a4): Corresponding to Step (II)

Figure 8G:
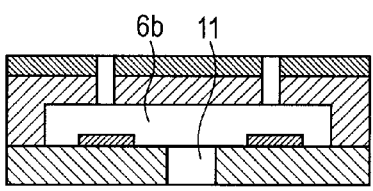
Figure 8D:
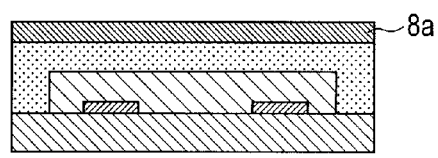

Next, the second coating resin layer 8a including a second cationic polymerization resin and a second photoacid generator is laminated on the first coating resin layer 7a (FIG. 8D).

The second cationic polymerization resin may be any cationic polymerization resin having an acid-cleavable linkage in its main chain, and examples thereof include such compounds as represented by the formula 1-a to the formula 1-i as described above.

The second photoacid generator may be any photoacid generator which generates methide acid by irradiation with an active energy ray including ultraviolet light, and examples thereof include such compounds as represented by the formula 6-a to the formula 6-j as described above.

A process for forming the second coating resin layer 8a is, for example, the following process. That is, the process is a process including applying a solution which is obtained by appropriately dissolving materials for the second coating resin layer 8a in a solvent, onto the first coating resin layer 7a by a spin coating process.

The thickness of the second coating resin layer 8a is not particularly limited as long as the cationic polymerization resin is not completely decomposed by methide acid generated from the photoacid generator in the step (a7) to be described later, but is desirably 5 μm or more in terms of a thickness on the first coating resin layer 7a.

Step (a5): Corresponding to Step (III)

Next, the first coating resin layer 7a and the second coating resin layer 8a are cured through exposure of the first coating resin layer 7a and the second coating resin layer 8a to an active energy ray including ultraviolet light (arrows of FIG. 2C) to conduct development. Thus, a coating having the ink ejection orifices 10 formed therein is produced (FIGS. 8E and 8F). It should be noted that the coating is formed of a first coating 7b and a second coating 8b.

A process for forming the ink ejection orifices is, for example, the following process. First, the first coating resin layer 7a and the second coating resin layer 8a are irradiated with the i-line as an active energy ray via a mask 9 corresponding to the shape of each of the ink ejection orifices 10. After that, the first coating 7b and the second coating 8b are formed by curing the first coating resin layer 7a and the second coating resin layer 8a through heating, development, and rinsing treatment of the layers, respectively. Thus, the coating having formed therein the ink ejection orifices 10 can be produced.

The width of each of the ink ejection orifices 10 may be appropriately set depending on the size of each of ink droplets to be ejected.

Step (a6)

Next, an ink supply port 11 is formed by etching. In addition, the ink flow path pattern 6a is removed to form an ink flow path 6b (FIG. 8G).

A process for removing the ink flow path pattern 6a is, for example, a process including removing the ink flow path pattern 6a by immersing the substrate in a solvent capable of dissolving the ink flow path pattern. Further, as necessary, the ink flow path pattern 6a may be exposed to an active energy ray capable of photosensitizing the ink flow path pattern to enhance the solubility.

Step (a7): Corresponding to Step (IV)

Figure 8H:
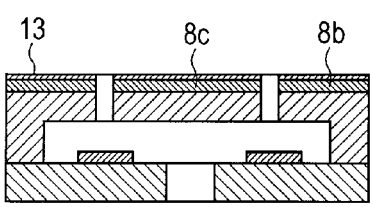

Next, a hydrophilic layer 8c is formed on a surface of the coating, i.e., a surface layer of the second coating 8b through heat treatment (FIG. 8H).

The heat treatment may be carried out at any temperature as long as an acid generated from the second photoacid generator in the second coating 8b can cause acid cleavage of an ether group or ester group present in the second cationic polymerization resin to generate a polar group and hydrophilize the surface layer. The temperature is preferably 160° C. or more as described above. Further, the temperature is preferably 250° C. or less in consideration of physical properties of the coating resin layer as described above.

It should be noted that the ink flow path surface preferably has a contact angle with pure water of 50° or more.

The "ink flow path surface" as used herein refers to a surface on the ink flow path 6b side of the first coating 7b, and the contact angle at this site may be measured as a static contact angle with pure water by peeling the first coating 7b from the substrate 4, for example.

The contact angle with pure water is preferably 50° or more and preferably 70° or less in consideration of the efficient refilling of ink and the stability of meniscus oscillation of ink after the refilling.

After that, the energy generating elements 5 are electrically joined in order to drive the elements. In addition, an ink supply member 12 for supplying ink and the like are connected. Thus, an ink jet recording head is completed (FIG. 7).

The ink jet recording head according to the present invention is mountable to apparatuses such as a printer, a copier, a facsimile having a communication system, and a word processor having a printer unit, and industrial recording apparatuses integrally combined with various processing apparatuses. Further, the use of the ink jet recording head of the present invention allows recording in a variety of recording media made of paper, yarn, fiber, leather, metal, plastic, glass, wood, ceramic, and the like.

EXAMPLES

Production of Ink Jet Recording Head

Hereinafter, the present invention is further specifically described by way of examples. However, the present invention is not limited to these examples.

Evaluation of Contact Angle

A surface having ink ejection orifices (ink ejection orifice surface: reference numeral 13 of FIG. 8H) of an ink jet recording head produced in each of Examples was measured for its static contact angle with pure water using a contact angle meter (trade name: "FACE CA-XA150" manufactured by Kyowa Interface Science Co., Ltd.).

Example 1

First, as illustrated in FIG. 8A, polymethyl isopropenyl ketone (trade name: "ODUR-1010" manufactured by TOKYO OHKA KOGYO CO., LTD.) as a positive photosensitive resin was applied onto a silicon substrate 4 having electrothermal transducing elements 5 formed thereon as energy generating elements by spin coating. Next, the silicon substrate was subjected to prebaking at 120° C. for 6 minutes. Then, pattern exposure of an ink flow path pattern 6a (exposure amount: 14 J/cm$^2$) was carried out with a Deep UV exposing machine (trade name: "UX-3000" manufactured by Ushio Inc.). After that, the resultant was developed with methyl isobutyl ketone and subjected to rinsing treatment with isopropyl alcohol (IPA). Thus, the ink flow path pattern 6a was formed (FIG. 8B). It should be noted that the ink flow path pattern 6a had a thickness of 10 μm.

Next, the following resin composition 1 was dissolved at a concentration of 50 mass % in a mixed solvent of methyl isobutyl ketone and diethylene glycol monomethyl ether. The solution was applied onto the ink flow path pattern 6a and the silicon substrate 4 by spin coating, thereby forming a first coating resin layer 7a (FIG. 8C). It should be noted that the thickness of the first coating resin layer 7a on the ink flow path pattern 6a (distance from the surface of the first coating resin layer 7a to the ink flow path pattern 6a) was 10 μm.

Resin Composition 1

First Cationic Polymerization Resin

"157S70" (trade name: manufactured by Japan Epoxy Resin Co., Ltd., compound represented by the formula 2-a): 100 parts by mass

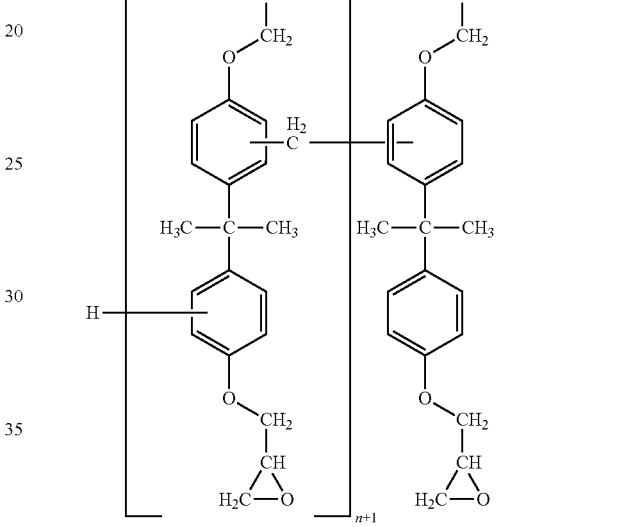

(2-a)

(In the formula 2-a, n represents an integer of 1 or more.)

First Photoacid Generator

Compound represented by the formula 4-a: 1.5 parts by mass

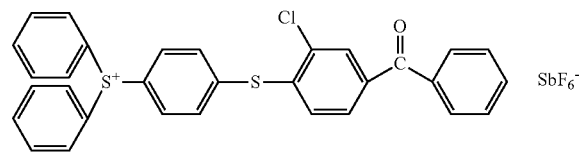

(4-a)

Next, the following resin composition 2 was dissolved at a concentration of 50 mass % in a mixed solvent of methyl isobutyl ketone and diethylene glycol monomethyl ether. Next, the solution was applied onto the first coating resin layer 7a by spin coating, thereby forming a second coating resin layer 8a (FIG. 8D). It should be noted that the thickness of the second coating resin layer 8a on the first coating resin layer 7a was 8 μm.

Resin Composition 2
Second Cationic Polymerization Resin
"EHPE-3150" (trade name: manufactured by Daicel Chemical Industries Limited, compound represented by the formula 1-a): 100 parts by mass

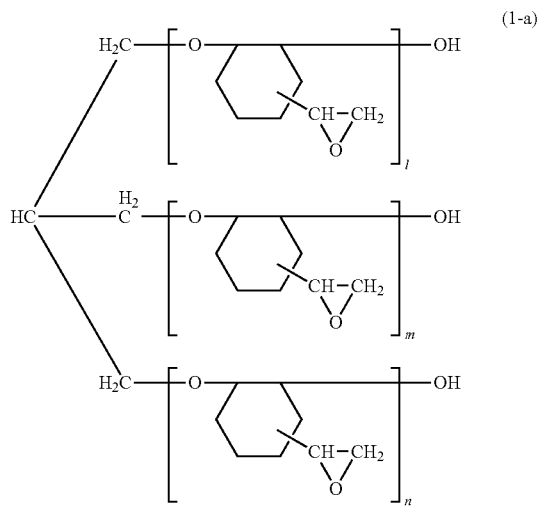

(1-a)

(In the formula 1-a, l, m, and n each independently represent an integer of 1 or more.)

Second Photoacid Generator

"GSID26-1" (trade name, manufactured by Ciba Japan K.K., compound represented by the formula 6-a): 1.5 parts by mass

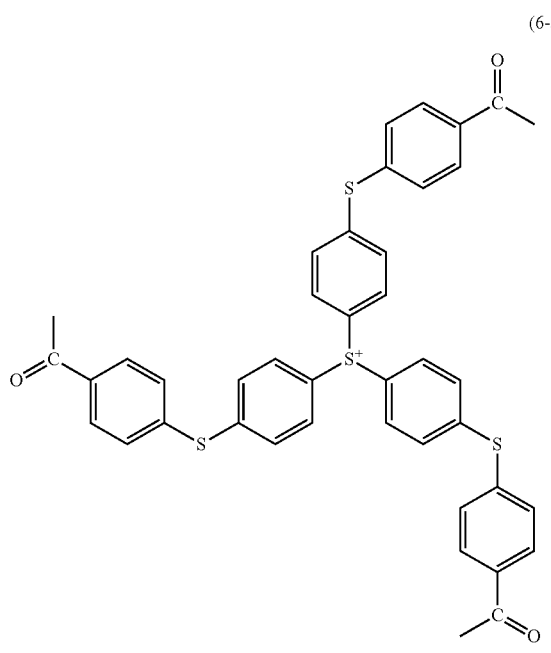

(6-a)

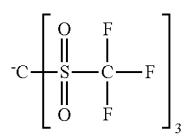

Next, the first coating resin layer 7a and the second coating resin layer 8a were exposed (exposure amount: 4,000 J/m$^2$) via a mask 9 corresponding to the shape of each of ink ejection orifices 10 using an i-line stepper exposing machine (i5 manufactured by Canon Inc.) (FIG. 8E).

Next, the layers were subjected to post-exposure baking (PEB) at 90° C. for 4 minutes, development with methyl isobutyl ketone, and rinsing treatment with IPA. Thus, the first coating resin layer 7a and the second coating resin layer 8a were cured to produce a coating (first coating 7b and second coating 8b) having formed therein the ink ejection orifices 10 (FIG. 8F). It should be noted that any of the ink ejection orifices 10 had a diameter of 10 μm.

Next, the resultant coating was subjected to etching in tetramethylammonium hydroxide (TMAH) to form an ink supply port 11. Then, in order to enhance the solubility of the ink flow path pattern 6a, the coating was exposed (exposure amount: 27 J/cm$^2$) again with the Deep UV exposing apparatus (trade name: "UX-3000" manufactured by Ushio Inc.) used in forming the ink flow path pattern 6a. After that, the resultant was immersed in methyl lactate while being irradiated with an ultrasound to dissolve the remaining ink flow path pattern 6a (FIG. 8G).

Next, hydrophilization was carried out by generating a polar group derived from the second cationic polymerization resin in the surface layer of the second coating 8b by heating at 200° C. for 1 hour (FIG. 8H).

Finally, an ink supply member 12 was bonded to the back surface of the silicon substrate 4 having formed therein the ink supply port 11. Thus, an ink jet recording head was completed (FIG. 7).

Table 3 shows the evaluation results of the contact angle of the ink ejection orifice surface of the ink jet recording head.

Example 2

An ink jet recording head was produced and evaluated in the same manner as in Example 1 except that the following resin composition 3 was used in place of the resin composition 2. Table 3 shows the evaluation results.

Resin Composition 3
Second Cationic Polymerization Resin
"XA8040" (trade name: manufactured by Japan Epoxy Resin Co., Ltd., compound represented by the formula 1-e): 100 parts by mass

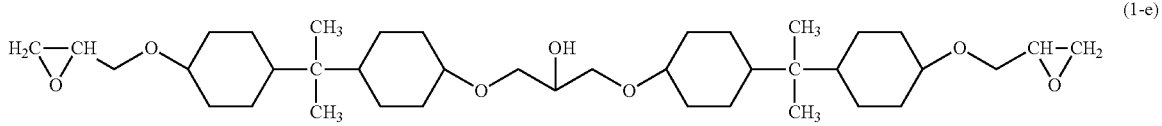

(1-e)

Second Photoacid Generator

"GSID26-1" (trade name, manufactured by Ciba Japan K.K., compound represented by the formula 6-a): 1.5 parts by mass

Comparative Example 1

An ink jet recording head was produced and evaluated in the same manner as in Example 1 except that the following resin composition 4 was used in place of the resin composition 2. Table 4 shows the evaluation results. It should be noted that the cationic polymerization resin (compound represented by the formula 2-a) in the resin composition 4 is free of an acid-cleavable linkage, and does not comply with requirements of the second cationic polymerization resin to be used in the present invention.

Resin Composition 4

Cationic Polymerization Resin

"157S70" (trade name: manufactured by Japan Epoxy Resin Co., Ltd., compound represented by the formula 2-a): 100 parts by mass Photoacid Generator "GSID26-1" (trade name, manufactured by Ciba Japan K.K., compound represented by the formula 6-a): 1.5 parts by mass

Comparative Example 2

An ink jet recording head was produced and evaluated in the same manner as Example 1 except that the following resin composition 5 was used in place of the resin composition 1 and the resin composition 4 was used in place of the resin composition 2. Table 4 shows the evaluation results.

Resin Composition 5

Cationic Polymerization Resin

"EHPE-3150" (trade name: manufactured by Daicel Chemical Industries Limited, compound represented by the formula 1-a): 100 parts by mass Photoacid Generator Compound represented by the formula 4-a: 1.5 parts by mass

Comparative Example 3

An ink jet recording head was produced and evaluated in the same manner as Example 1 except that the resin composition 2 was used in place of the resin composition 1 and the resin composition 5 was used in place of the resin composition 2. Table 4 shows the evaluation results. It should be noted that the photoacid generator in the resin composition 5 is a photoacid generator which generates antimonic acid, and does not comply with requirements of the second photoacid generator to be used in the present invention.

Comparative Example 4

An ink jet recording head was produced and evaluated in the same manner as Example 1 except that the resin composition 4 was used in place of the resin composition 1 and the resin composition 1 was used in place of the resin composition 2. Table 4 shows the evaluation results. The cationic polymerization resin (compound represented by the formula 2-a) in the resin composition 1 does not comply with requirements of the second cationic polymerization resin to be used in the present invention. Further, the photoacid generator (compound represented by the formula 4-a) in the resin composition 1 does not comply with requirements of the second photoacid generator to be used in the present invention either.

Comparative Example 5

An ink jet recording head was produced and evaluated in the same manner as Example 1 except that the resin composition 5 was used in place of the resin composition 1 and the second coating resin layer 8a was not formed. Table 4 shows the evaluation results.

TABLE 3
| | First coating resin layer | |
|---|---|---|
| | Cationic polymerization resin | Photoacid generator |
| Example 1 | 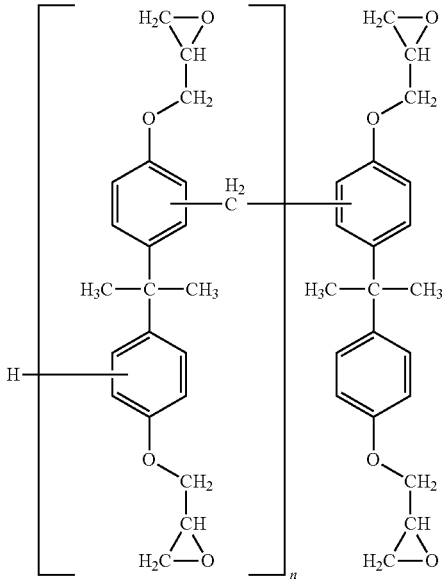<br>(2-a) | 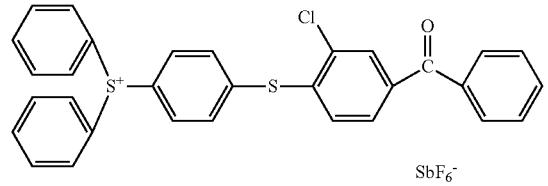<br>(4-a) |
| Example 2 | 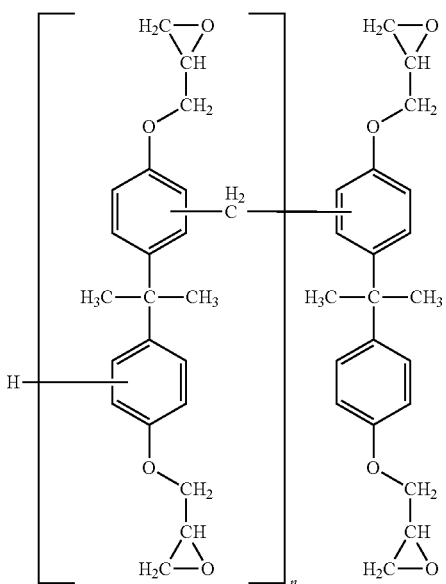<br>(2-a) | 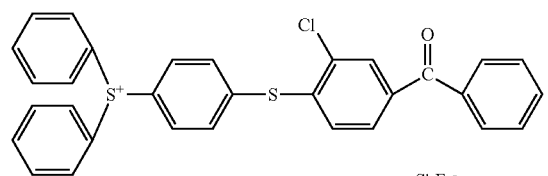<br>(4-a) |

TABLE 3-continued
Second coating resin layer
Cationic polymerization resin
| | |
|---|---|
| Example 1 | 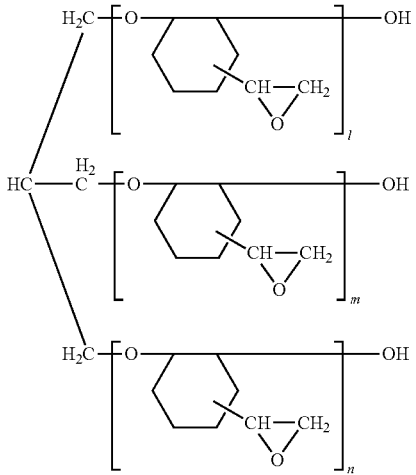 (1-a) |
| Example 2 | 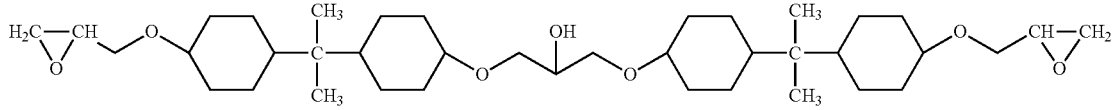 [SMILES: CC(C)(C1CCC(OCC(O)COC2CCC(C(C)(C)C3CCC(OCC4CO4)CC3)CC2)CC1)C1CCC(OCC2CO2)CC1] (1-e) |
| Second coating resin layer Photoacid generator | Contact angle with pure water |
|---|---|
| Example 1 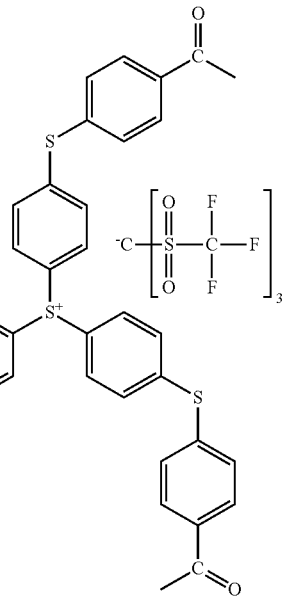 (6-a) | 20° or less |

TABLE 3-continued

| Example 2 | (6-a) [structure] | 20° or less |

TABLE 4

| First coating resin layer |||
|---|---|---|
| Cationic polymerization resin || Photoacid generator |
| Comparative Example 1 | (2-a) [structure] | (4-a) [structure] SbF₆⁻ |

TABLE 4-continued
| | | |
|---|---|---|
| Comparative Example 2 | 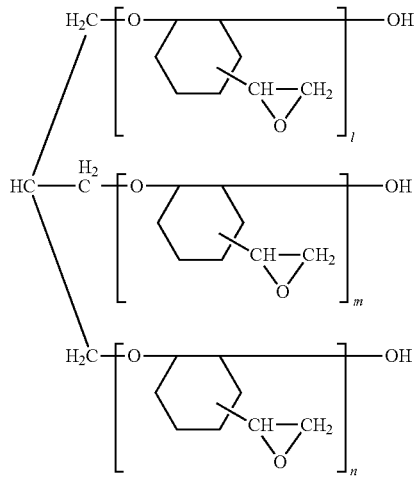 (1-a) | 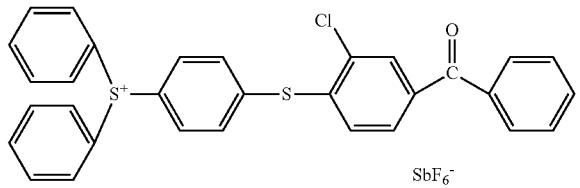 (4-a) |
| Comparative Example 3 | 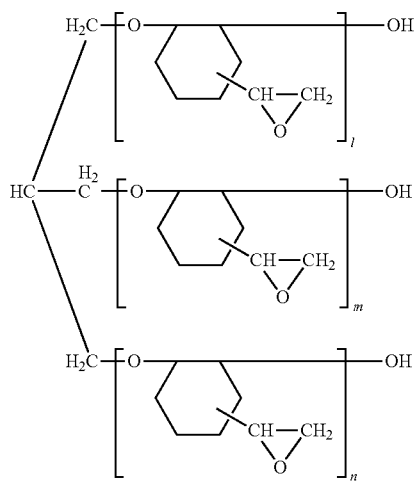 (1-a) | 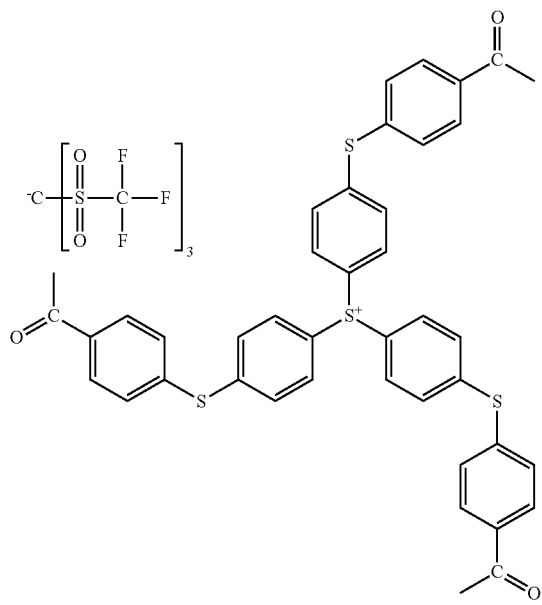 (6-a) |

TABLE 4-continued
| Comparative Example 4 | 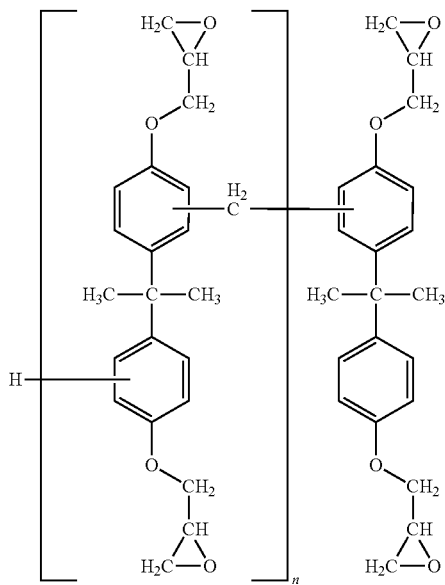 (2-a) | 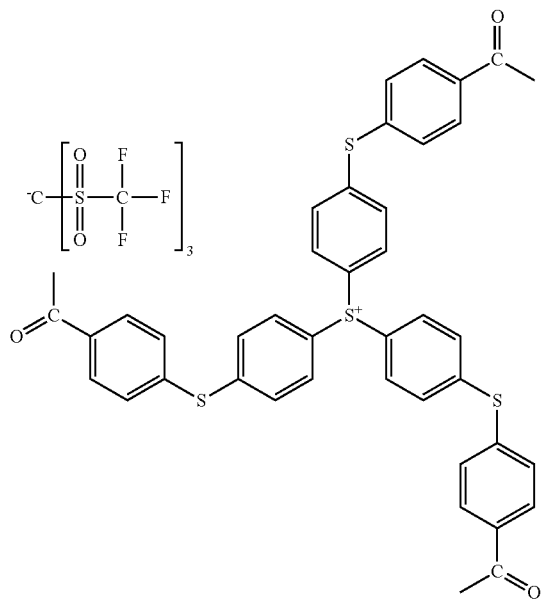 (6-a) |
|---|---|---|
| Comparative Example 5 | 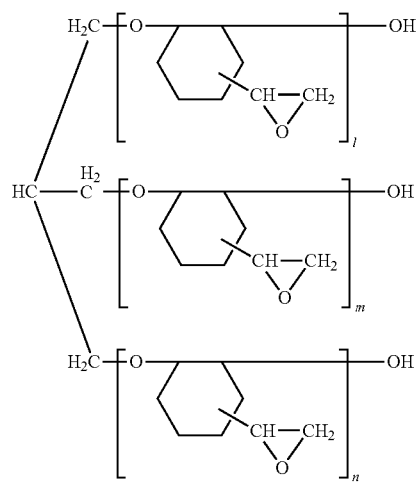 (1-a) | 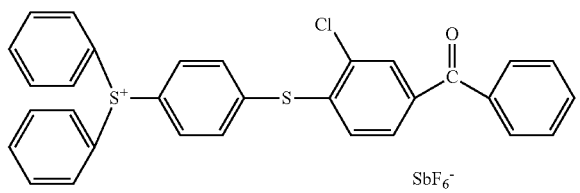 (4-a) |

TABLE 4-continued

| | Second coating resin layer | | contact angle with pure water |
|---|---|---|---|
| | Cationic polymerization resin | Photoacid generator | |
| Comparative Example 1 | (2-a) | (6-a) | 60° |
| Comparative Example 2 | (2-a) | (6-a) | 60° |

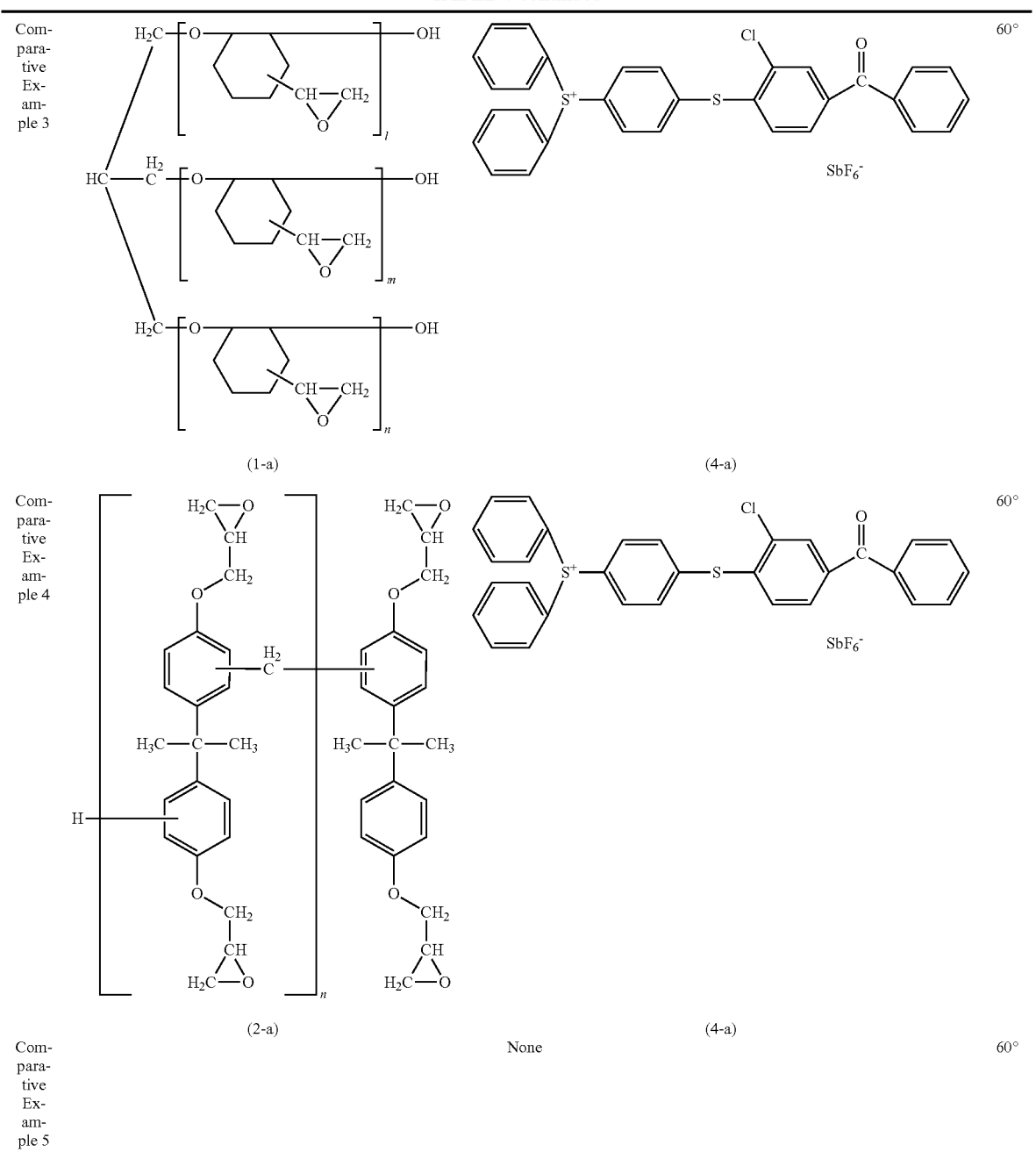

As shown in Table 3, an ink jet recording head having an ink flow path member 15 whose ink ejection orifice surface was subjected to hydrophilic treatment was able to be produced by Example 1 and Example 2.

According to the present invention, it is possible to provide the process for easily forming a hydrophilic coating by photolithography without requiring any apparatus exclusively used for hydrophilic treatment, and the hydrophilic coating formed by the process. It is also possible to provide the process for forming an ink jet recording head including the hydrophilic coating and the ink jet recording head formed by the process.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-250778, filed Nov. 9, 2010, which is hereby incorporated by reference herein in its entirety.

What is claimed is:

1. A process for forming a hydrophilic coating, which is a coating having a hydrophilized surface, comprising the steps of:
    (1) forming, on a substrate, a first coating resin layer including a first cationic polymerization resin and a first photoacid generator;

(2) laminating, on the first coating resin layer, a second coating resin layer including a second cationic polymerization resin which includes an acid-cleavable linkage in its main chain, and a second photoacid generator which generates methide acid by irradiation with an active energy ray including ultraviolet light;
(3) forming a coating by curing the first coating resin layer and the second coating resin layer through exposure of the first coating resin layer and the second coating resin layer to the active energy ray to conduct development; and
(4) forming a hydrophilic coating by hydrophilizing a surface of the coating obtained in the step (3) through heat treatment of the coating,
wherein the second cationic polymerization resin comprises an ether linkage or an ester linkage in its main chain,
wherein the second photoacid generator comprises a compound represented by the following formula (6-a):

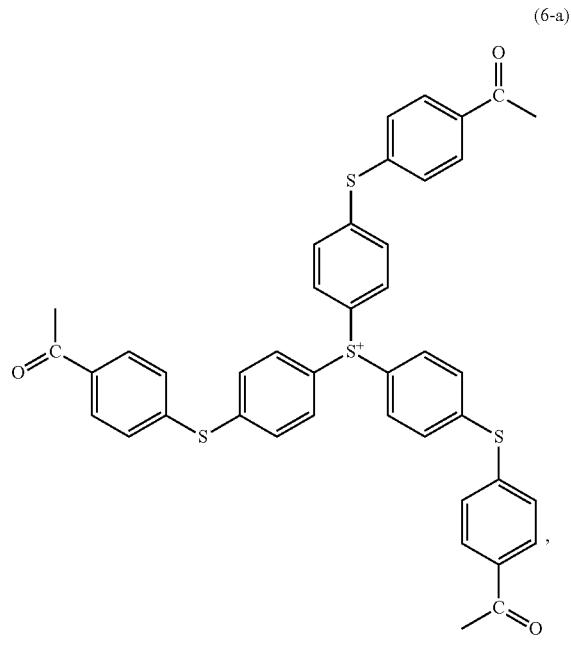

(6-a)

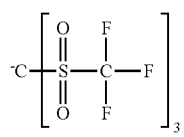

and
wherein the second coating layer has a thickness of 5 μm or more.

2. A process for forming a hydrophilic coating according to claim 1, wherein the first cationic polymerization resin is free of an acid-cleavable linkage in its main chain.

3. A process for forming a hydrophilic coating according to claim 1, wherein the first cationic polymerization resin is free of an ether linkage in its main chain.

4. A process for forming a hydrophilic coating according to claim 1, wherein the first cationic polymerization resin is free of an ester linkage in its main chain.

5. A process for forming a hydrophilic coating according to claim 1, wherein the first photoacid generator generates antimonic acid by irradiation with the active energy ray.

6. A process for forming a hydrophilic coating according to claim 1, wherein the second cationic polymerization resin comprises an ether linkage as an acid-cleavable linkage in its main chain.

7. A process for forming a hydrophilic coating according to claim 1, wherein the second cationic polymerization resin comprises an ester linkage as an acid-cleavable linkage in its main chain.

8. A process for forming a hydrophilic coating according to claim 1, wherein the first cationic polymerization resin comprises a compound represented by the following formula 2-a, and the first photoacid generator comprises a compound represented by the following formula 4-a:

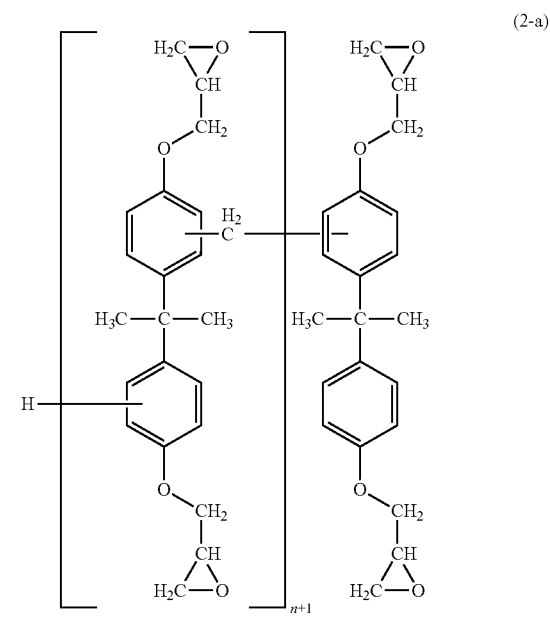

in the formula 2-a, n represents an integer of 1 or more.

9. A process for forming a hydrophilic coating according to claim 1, wherein the second cationic polymerization resin comprises a compound represented by the following formula 1-a, and the second photoacid generator comprises a compound represented by the following formula 6-a:

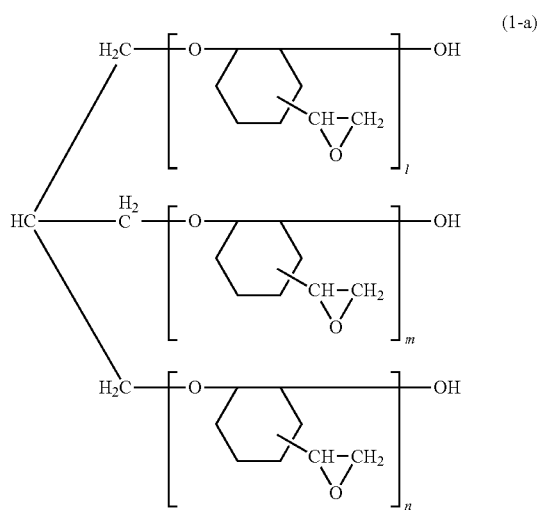

(1-a)

in the formula 1-a, l, m, and n each independently represent an integer of 1 or more.

10. A process for forming a hydrophilic coating according to claim 1, wherein the heat treatment of the coating obtained in the step (3) in the step (4) is carried out at a temperature of 160° C. or more.

11. A process for forming an ink jet recording head comprising an ink flow path member which forms ejection orifices for ejecting ink and an ink flow path communicating with the ejection orifices and holding ink and is hydrophilized in its surface having the ejection orifices, and a substrate having energy generating elements formed thereon for generating energy necessary for ejecting ink, the process comprising the steps of:

(I) forming a first coating resin layer including a first cationic polymerization resin and a first photoacid generator on the substrate having formed thereon the energy generating elements;

(II) laminating, on the first coating resin layer, a second coating resin layer including a second cationic polymerization resin which includes an acid-cleavable linkage in its main chain, and a second photoacid generator which generates methide acid by irradiation with an active energy ray including ultraviolet light;

(III) producing a coating having the ejection orifices formed therein by curing the first coating resin layer and the second coating resin layer through exposure of the first coating resin layer and the second coating resin layer to the active energy ray to conduct development; and (IV) forming the ink flow path member by hydrophilizing a surface having the ejection orifices of the coating obtained in the step (III) through heat treatment of the coating, wherein the second cationic polymerization resin comprise an ether linkage or an ester linkage in its main chain, wherein the second photoacid generator comprises a compound represented by the following formula (6-a):

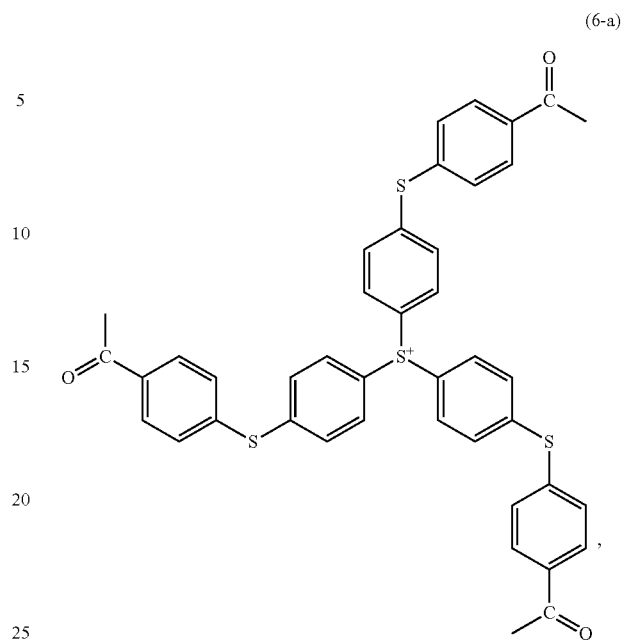

(6-a)

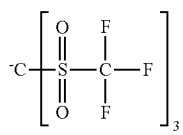

and wherein the second coating resin layer has a thickness of 5 µm or more.

12. A process for forming an ink jet recording head according to claim 11, wherein the first cationic polymerization resin is free of an acid-cleavable linkage in its main chain.

13. A process for forming an ink jet recording head according to claim 11, wherein the first cationic polymerization resin is free of an ether linkage in its main chain.

14. A process for forming an ink jet recording head according to claim 11, wherein the first cationic polymerization resin is free of an ester linkage in its main chain.

15. A process for forming an ink jet recording head according to claim 11, wherein the first photoacid generator generates antimonic acid by irradiation with the active energy ray.

16. A process for forming an ink jet recording head according to claim 11, wherein the second cationic polymerization resin comprises an ether linkage as an acid-cleavable linkage in its main chain.

17. A process for forming an ink jet recording head according to claim 11, wherein the second cationic polymerization resin comprises an ester linkage as an acid-cleavable linkage in its main chain.

18. A process for forming an ink jet recording head according to claim 11, wherein the first cationic polymerization resin comprises a compound represented by the following formula 2-a, and the first photoacid generator comprises a compound represented by the following formula 4-a:

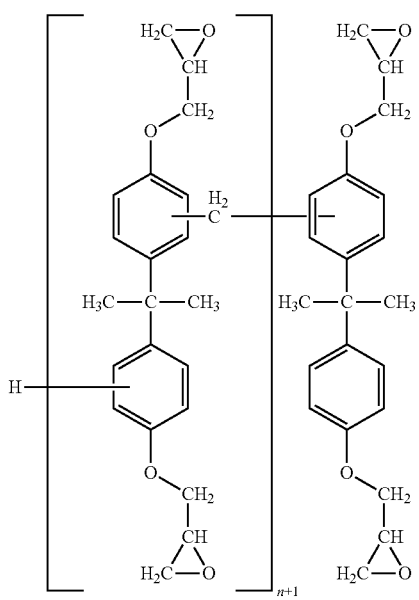
(2-a)
in the formula 2-a, n represents an integer of 1 or more.
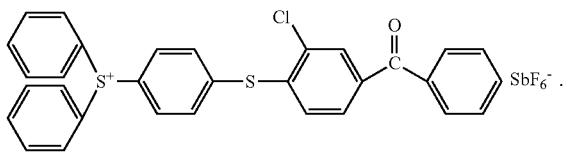
(4-a)
19. A process for forming an ink jet recording head according to claim 11, wherein the second cationic polymerization resin comprises a compound represented by the following formula 1-a:
(1-a)
in the formula 1-a, l, m, and n each independently represent an integer of 1 or more.
* * * * *